United States Patent
Cho et al.

(10) Patent No.: US 7,410,749 B2
(45) Date of Patent: Aug. 12, 2008

(54) METHOD OF FABRICATING MICRO-LENS AND METHOD OF FABRICATING OPTICAL MODULE USING THE METHOD

(75) Inventors: Jae-Geol Cho, Suwon-shi (KR); Sun-Tae Jung, Anyang-shi (KR)

(73) Assignee: Samsung Electronics Co., Ltd., Maetan-Dong, Yeongtong-Gu, Suwon-Si, Gyeonggi-Do (KR)

( * ) Notice: Subject to any disclaimer, the term of this patent is extended or adjusted under 35 U.S.C. 154(b) by 258 days.

(21) Appl. No.: 10/735,192

(22) Filed: Dec. 12, 2003

(65) Prior Publication Data

US 2005/0003309 A1 Jan. 6, 2005

(30) Foreign Application Priority Data

Jul. 1, 2003 (KR) .................. 10-2003-0044410

(51) Int. Cl.
*G03F 7/00* (2006.01)
*G02B 6/13* (2006.01)

(52) U.S. Cl. .................. 430/321; 430/330; 385/14; 385/33; 385/35

(58) Field of Classification Search .............. None
See application file for complete search history.

(56) References Cited

U.S. PATENT DOCUMENTS 5,064,266 A * 11/1991 Sun et al. .................. 385/132
5,846,694 A * 12/1998 Strand et al. ............... 430/321

FOREIGN PATENT DOCUMENTS

| JP | 06-194502 | 7/1994 |
| JP | 05-326265 | 11/1994 |
| JP | 6-326285 A * | 11/1994 |
| JP | 07-027947 | 1/1995 |
| JP | 09-166728 | 6/1997 |
| JP | 2004-101783 | 4/2004 |

* cited by examiner

Primary Examiner—John A. McPherson
(74) Attorney, Agent, or Firm—Cha & Reiter, LLC

(57) ABSTRACT

A method of fabricating a micro-lens, and a method of fabricating an optical module using the method are provided. To fabricate a micro-lens, a thin film is formed of a material for the micro-lens on a substrate. A photoresist pattern is formed on the thin film, a thin-film structure is formed by etching the thin film using the photoresist pattern, and the micro-lens is completed by reflow by thermally treating the thin-film structure.

9 Claims, 11 Drawing Sheets

(a)

(b)

(c)

METHOD OF FABRICATING MICRO-LENS AND METHOD OF FABRICATING OPTICAL MODULE USING THE METHOD

CLAIM OF PRIORITY

This application claims priority under 35 U.S.C. § 119 from an application entitled "Method of Fabricating Micro-lens and Method of Fabricating Optical Module Using the Method," filed in the Korean Intellectual Property Office on Jul. 1, 2003 and assigned Ser. No. 2003-44410, the contents of which are incorporated herein by reference.

BACKGROUND OF THE INVENTION

1. Field of the Invention

The present invention relates generally to a micro-lens. More particularly, the present invention relates to a method of fabricating a micro-lens and a method of fabricating an optical module having a micro-lens integrated therein using the method.

2. Description of the Related Art

Micro-lenses are becoming increasingly popular today and can be found components such as optical sensors, optoelectronic products, and optical communications such as optical coupling between optical devices including an optical fiber, a PLC (Planar Lightwave Circuit), an LD (Laser Diode), and a PD (Photo Diode).

There have been many methods proposed that attempted to achieve high optical coupling efficiency in optical coupling between optical devices. Traditionally in the free space optic field, an optical device is assembled with a spherical lens ranging from hundreds of micrometers to tens of millimeters in diameter, a GRIN (Graded Index) lens; there can also be one or two aspherical lenses used, and a hemispherical-ended optical fiber is used to increase light receiving efficiency. Owing to the recent development of integrated optical devices, a micro-lens having a diameter of hundreds of micrometers or less and capable of collecting light perpendicularly to an Si, InP, or $SiO_2$ substrate and a lens array having such micro-lenses are also formed.

Such a micro-lens array is widely used in a CCD (Charge Coupled Device) image sensor and an FPA (Focal Plane Array), especially in a Hartmann-Shack Wavefront sensor for measuring the aberrations of the eye. A major conventional method of fabricating such the micro-lens and lens array is photoresist (PR) reflow.

FIGS. 1A to 1D sequentially illustrate a prior art PR reflow-based micro-lens fabricating method, and FIG. 2 is an enlarged microscope picture of a micro-lens fabricated by the conventional PR reflow.

Referring to FIG. 1A, thick photoresist PR patterns 12 are formed on a substrate 11 of silicon, quartz, InP, or GaP.

Subsequently, as shown in FIG. 1B, the PR patterns 12 are shaped into convex lenses 13 due to surface tension by reflow at a high temperature.

After shaping the PR patterns into convex lenses 13, FIG. 1C shows the next step wherein the convex lens-shaped PR patterns 13 are transferred to the substrate 11 by an etching process using the PR patterns 13. One such type of etching process that can be used is, for example, RIE (Reactive Ion Etching).

Finally, at FIG. 1D, the lenses 14 are shown after fabrication is completed.

This conventional micro-lens fabricating method suffers from a low yield because the PR is very sensitive to temperature and humidity, making it difficult to easily reproduce the micro-lenses. Moreover, the thickness of the lenses is limited. Therefore, the micro-lenses are not feasible for light collection in parallel to the substrate with optical devices, such as an LD and an optical fiber/PLC for optical coupling, integrated thereon.

Referring to FIG. 3, in an attempt to solve the manufacturing problems, a non-reflective coated aspherical or spherical lens 31, which has a diameter ranging from hundreds of micrometers to tens of millimeters, is inserted between a laser diode LD 32 and an optical fiber/PLC 33.

However, the distance between the LD 32 and the spherical lens 31 is at least hundreds of micrometers. Thus, when light emitted from the LD 32 passes through the spherical lens 31, light that passes through the center of the spherical lens 31 and light that passes through the periphery of the spherical lens converge to different positions, resulting in a very low optical coupling efficiency, somewhere on order of about 10%. If an aspherical lens is used, the optical coupling efficiency will be increased, but the increased costs can be prohibitive in the practical use of such lenses for this purpose.

FIG. 4 illustrates a conventional method of construction, wherein an LD 41 formed on a substrate 41 by flip-chip bonding can be light-coupled directly to an optical fiber/PLC 43 within a range of tens of micrometers.

However, the conventional method illustrated in FIG. 4 suffers from a coupling loss due to the mode mismatch between the LD 42 and the optical fiber/PLC 43. Since the coupling loss is very sensitive to bonding accuracy, bonding errors cause a great amount of loss.

SUMMARY OF THE INVENTION

Therefore, one aspect of the present invention is to provide a method of fabricating a micro-lens adapted for collecting light perpendicularly, and in parallel to, a substrate having optical devices integrated therein, and a method of fabricating the optical module.

Yet another aspect of the present invention is to provide a method of fabricating a micro-lens which is more easily reproducible than known heretofore, easily aligned with an optical fiber or PLC, and easily fabricated, and a method of fabricating an optical module.

The above objects are achieved by a method of fabricating a micro-lens, and a method of fabricating an optical module using the method of fabricating the micro-lens. In order to fabricate a micro-lens, a thin film is formed of a material for the micro-lens on a substrate. A photoresist pattern is then formed on the thin film, a thin-film structure is formed by etching the thin film using the photoresist pattern, and the micro-lens is completed by a reflow process by thermally treating the thin-film structure.

Preferably, the shape of the micro-lens is controlled according to the distance between thin-film structures.

Preferably, the shape of the micro-lens is controlled according to the shape of the photoresist pattern and the thickness (or height) of the thin-film structure.

To fabricate an optical module having a micro-lens integrated, a lower cladding layer and a core layer are sequentially formed on a substrate. A PLC pattern is formed on the substrate by selectively etching the core layer and the lower cladding layer. A PLC is completed by forming an upper cladding layer on the overall surface of the substrate. A thin-film structure is formed in a lens forming area by selectively removing the upper cladding layer in an area other than the area of the PLC and the lens forming area. The micro-lens is finally formed by reflow by thermally treating the thin-film structure.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

FIGS. 5A to 5D are views sequentially illustrating a micro-lens fabricating method according to a preferred embodiment of the present invention.

Figure 5:
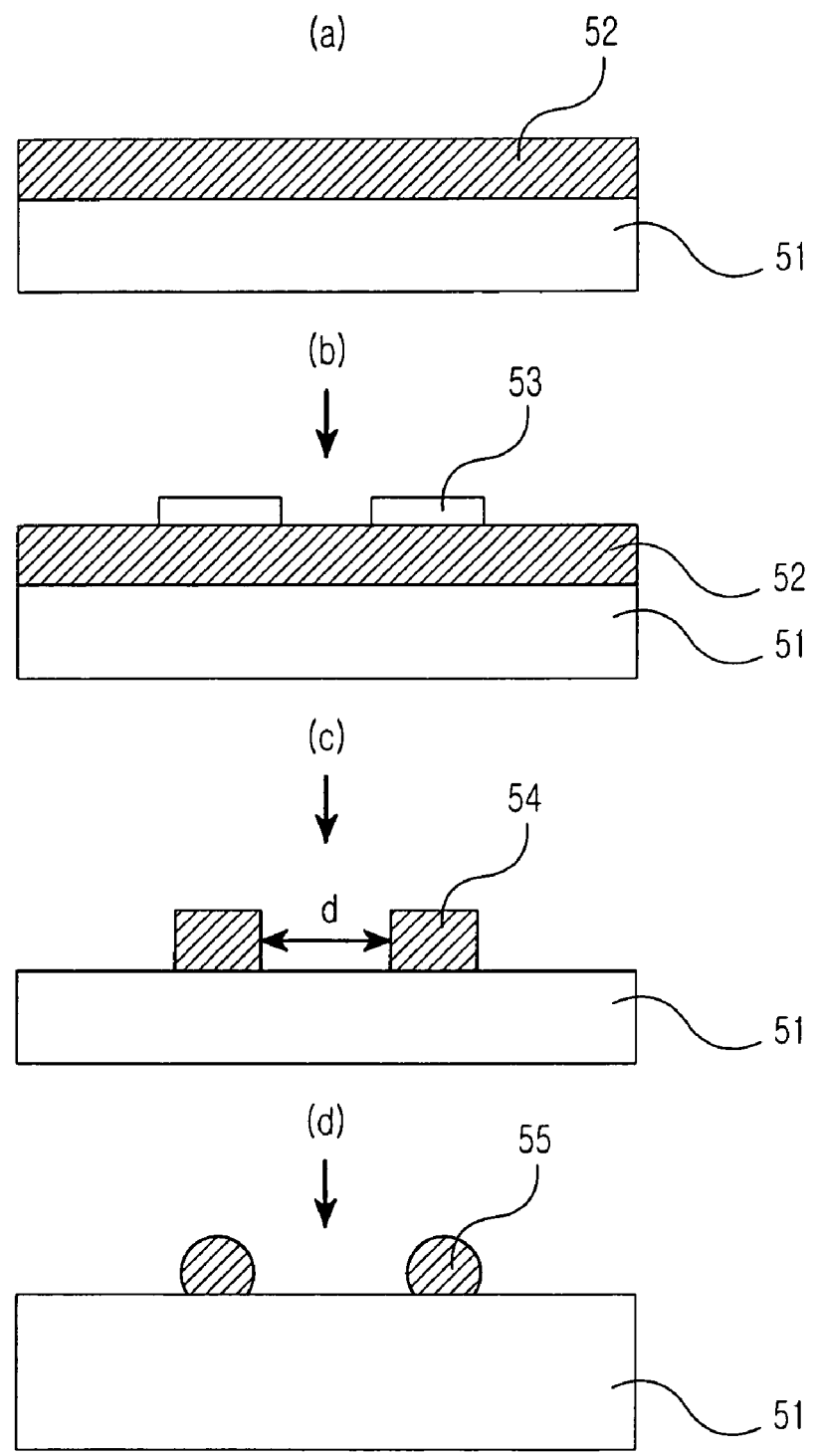
FIGS. 5A to 5D sequentially illustrate a method of fabricating a micro-lens according to a preferred embodiment of the present invention.

In FIG. 5A, an $SiO_2$ thin film 52, which is doped with $GeO_2$, $P_2O_5$, $B_2O_3$, etc., is formed on a silicon or quartz substrate 51 by Flame Hydrolysis Deposition (FHD) or Chemical Vapor Deposition (CVD).

In FIG. 5B, the photoresist (PR) patterns 53 are formed on the thin film 52 by photolithography. The shape of the PR patterns 53 can be polygonal or circular, depending on the shape, diameter, and height of an intended lens.

In FIG. 5C, thin-film structures 54 are formed in a three-dimensional shape such as a cylinder or a polygonal column by etching the thin film 52 along the PR pattern 53, for example, by RIE.

If the thin-film structures 54 are shaped into a long rectangle like a waveguide, a cylindrical lens having a semi-circular or circular section is most easily fabricated. If the etched pattern is a circle having a very large diameter relative to the thickness of the thin film, a convex lens having a long focus length is most easily fabricated. In one aspect of the present invention, a spherical lens is formed using a regular square PR pattern, that is, thin-film structures shaped like a quadratic tetrahedron column, and the sequence of the fabrication steps is kept irrespective of the size and shape of the lens.

Comparing FIG. 5C with FIG. 5D, the thin-film structures 54 (shown in FIG. 5C) are heated at a high temperature of hundreds of Celsius degrees so that a viscous flow is created. Due to the influence of increased surface tension that occurs during the heat treatment, the thin-film structures 54 are changed into spheres 55, taking the form of lenses.

In the above micro-lens fabrication method of the present invention, micro-lenses of various sizes and various shapes, such as hemispheres or spheres, can be formed according to the types and composition of dopants in the thick film, the temperature and duration of the heat treatment, the distance between thin-film structures (distance "d" in FIG. 5C), and the PR patterns (i.e., etching patterns).

Figure 6:
FIGS. 6A, 6B and 6C illustrate micro-lenses of different shapes according to different distances between thin-film structures.
Figure 6:
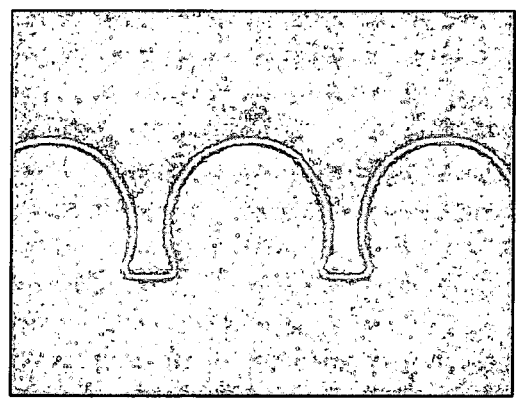
Figure 6:
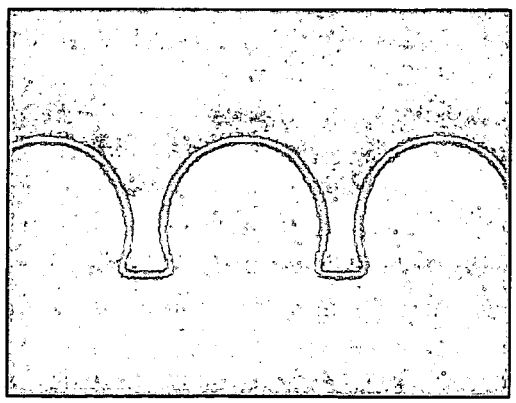

FIGS. 6A, 6B and 6C illustrate micro-lenses having different shapes according to process conditions. Commonly, the micro-lenses are formed by heating thin-film structures having a long rectangular section of about 6.5 μm each in height and width at 1050° C. for 12 hours. Depending on the distance d between thin-film structures, the micro-lenses have different shapes.

Referring to FIG. 6A, when the heat treatment is carried out under the same conditions, if d is small (e.g., d=1.2 μm), the micro-lenses have a semi-circular section.

FIG. 6B illustrates the sections of the micro-lenses when d is 2.2 μm. As illustrated in FIG. 6C, as d increases (e.g., d=6.2 μm), the section of the micro-lenses is approximate to a circle.

In addition, the shape of the micro-lenses can be controlled according to the temperature and duration of the heat treatment and the types and concentration of dopants in the thin film, as well as the distance between the thin-film structures. In accordance with the present invention, a plurality of lenses can be fabricated simultaneously on a single substrate since the process runs on a substrate basis. Therefore, an array of lens can be fabricated at a time depending on the use of the array.

Figure 7A:
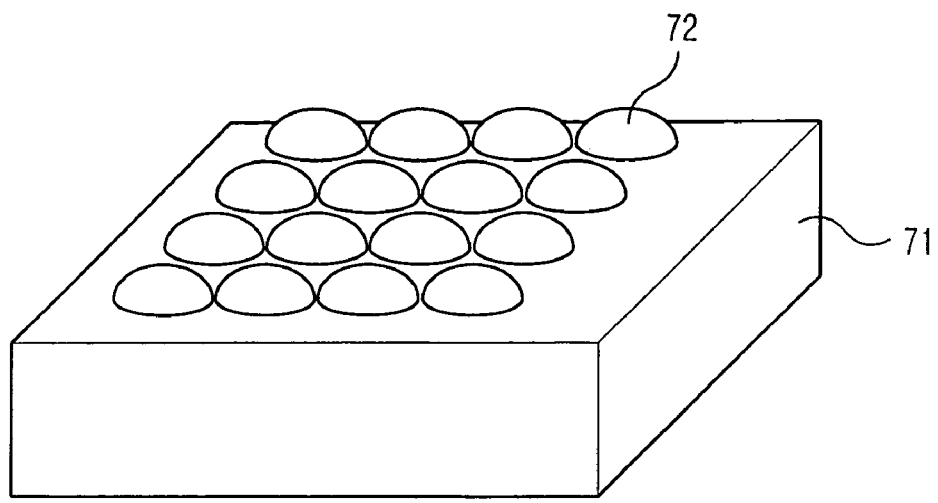
FIGS. 7A and 7B illustrate an exemplary array of aspherical lenses on a unit substrate according to the present invention.
Figure 7B:
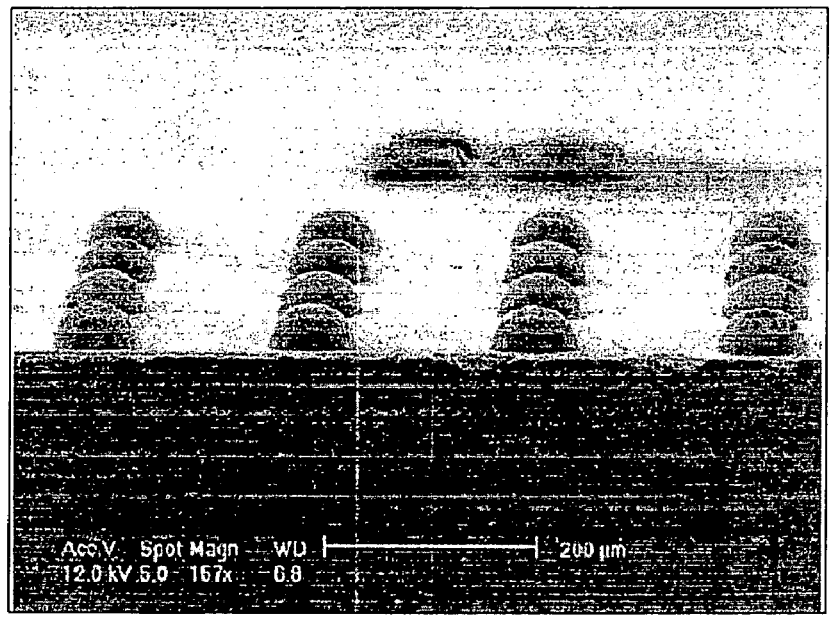
Figure 8A:
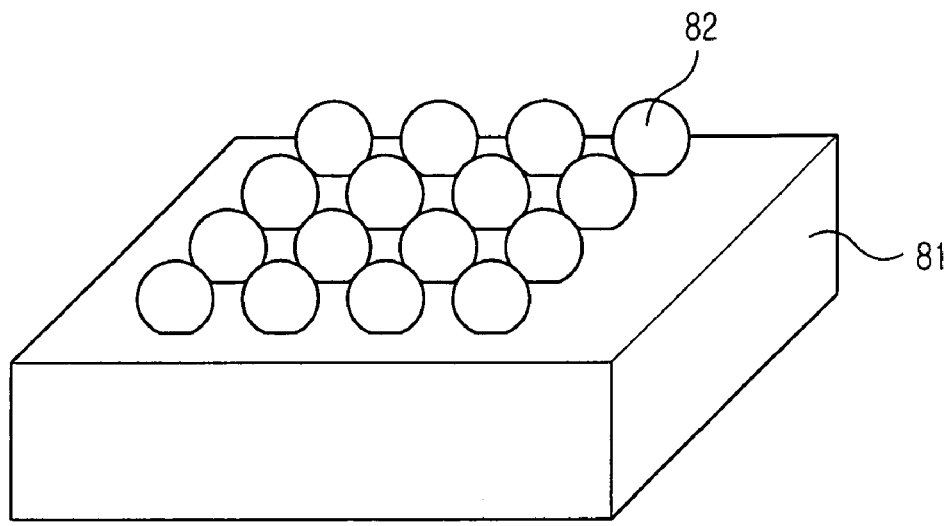
FIGS. 8A and 8B illustrate an exemplary array of spherical lenses on a unit substrate according to the present invention.
Figure 8B:
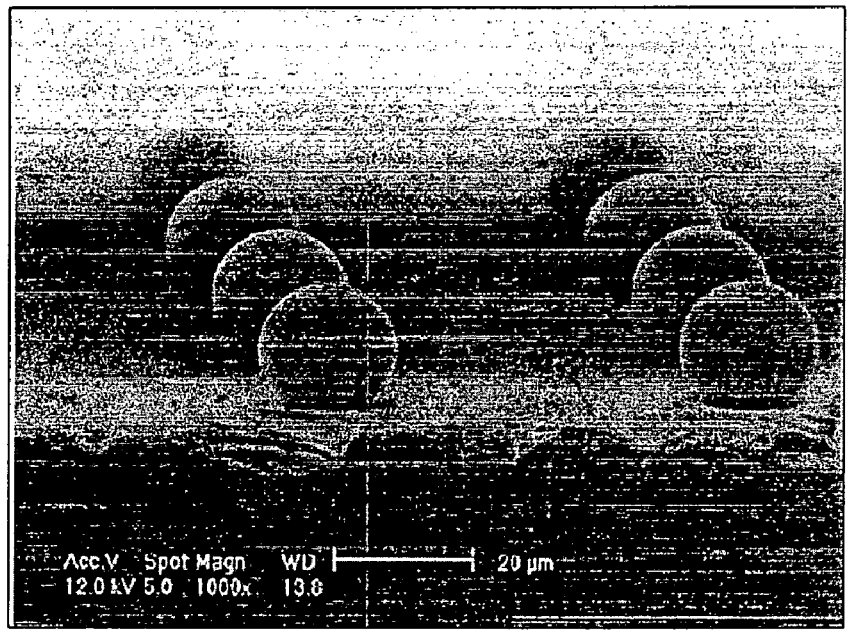

FIGS. 7A, 7B and 8A, 8B illustrate lens arrays on unit substrates 71 and 81, respectively. FIGS. 7B and 8B are enlarged microscope pictures of a micro-lens fabricated by FIGS. 7A and 8A, respectively. A lens array 72 illustrated in FIGS. 7A and 7B includes hemispherical lenses, while a lens array 82 illustrated in FIGS. 8A and 8B includes spherical lenses. FIGS. 7B and 8B illustrate array pictures of hemispherical and spherical lenses fabricated by heating at 900° C. for 10 hours after fabricating a cylinder column by etching doped silica ($SiO_2$ doped with $GeO_2$, $P_2O_5$, $B_2O_3$) thin film formed by FHD (Flame Hydrolysis Desposition). Herein, since both kinds of lens arrays described in FIGS. 7B and 8B are simultaneously fabricated on a single substrate, all fabrication conditions, i.e., thickness of a thin-film and heating condition, are the same except a size of an etching pattern. These lens arrays can be used for a CCD image sensor and a Hartmann-Shack wavefront sensor, etc.

Figure 9:
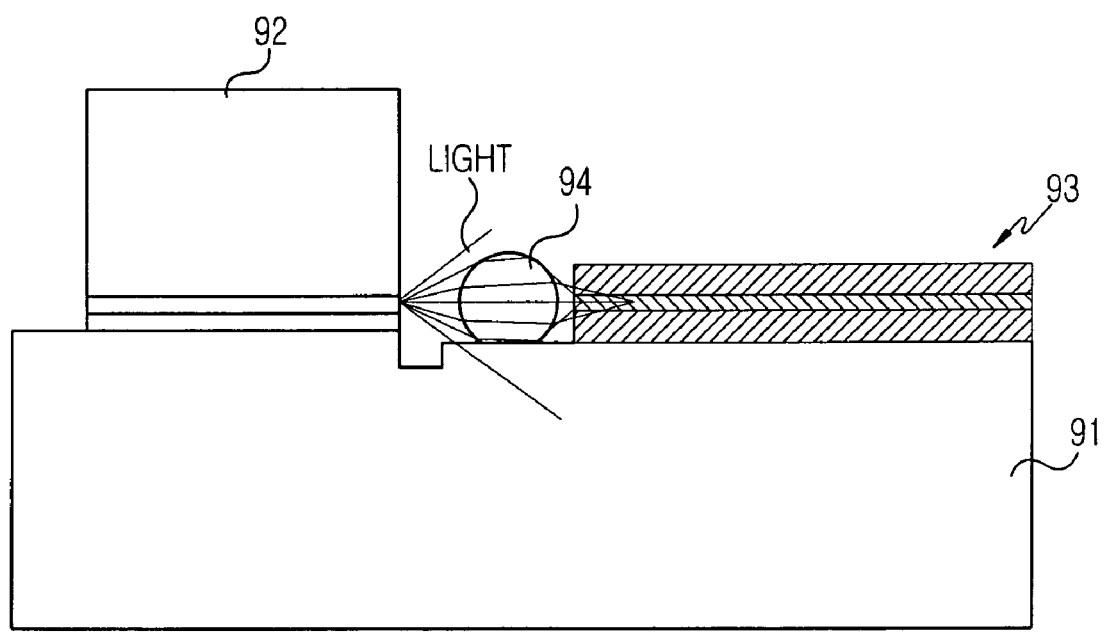
FIG. 9 depicts optical coupling between an LD and a PLC using a spherical lens fabricated according to the present invention.

FIG. 9 illustrates optical coupling between an LD and a PLC through a spherical lens fabricated according to the present invention.

Figure 1:
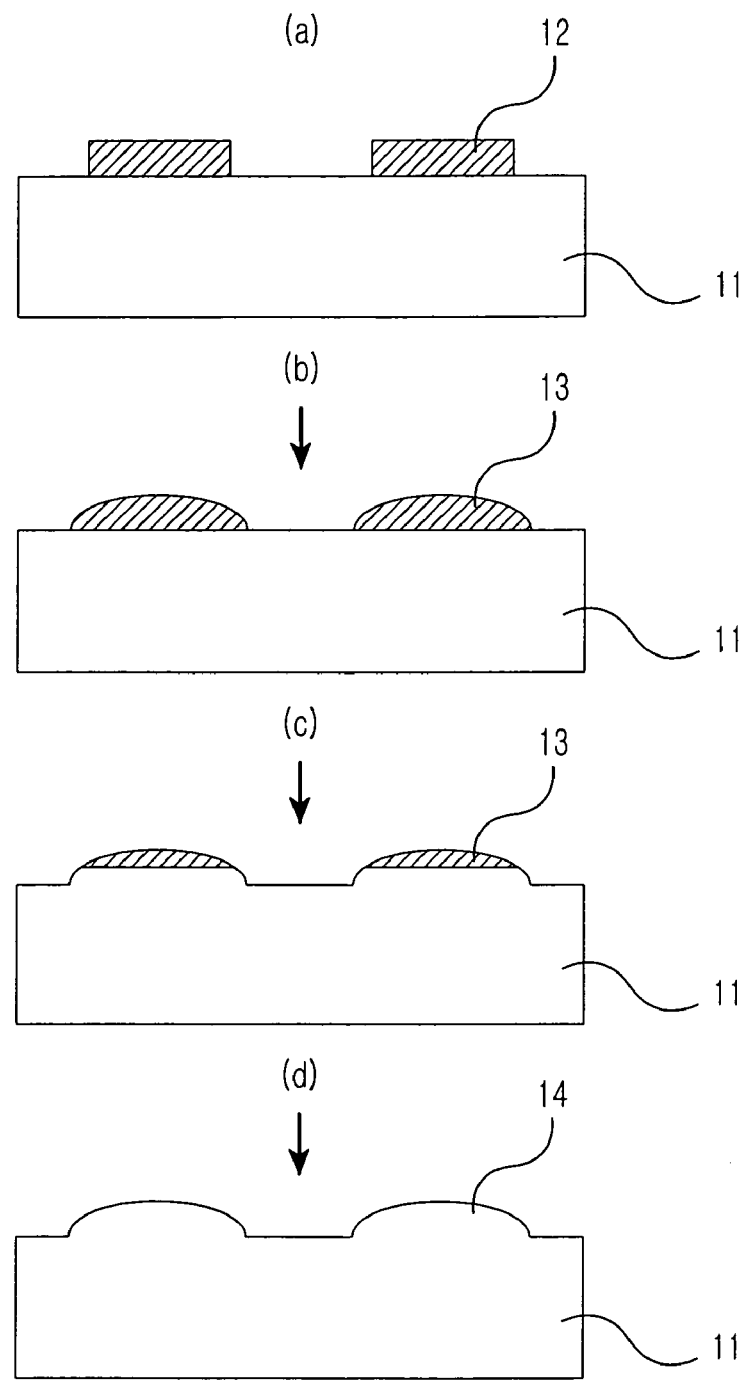
FIGS. 1A to 1D sequentially illustrate a conventional PR reflow-based micro-lens fabricating method.
Figure 2:
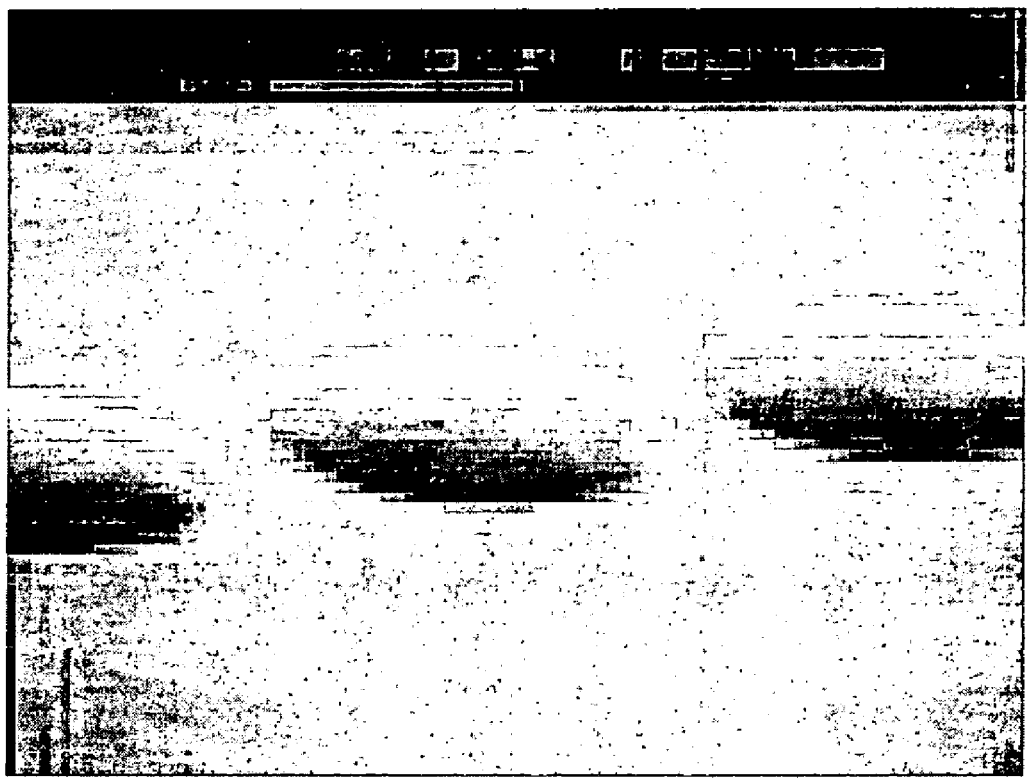
FIG. 2 is a high magnification microscope picture of a micro-lens fabricated by the conventional PR reflow method.
Figure 3:
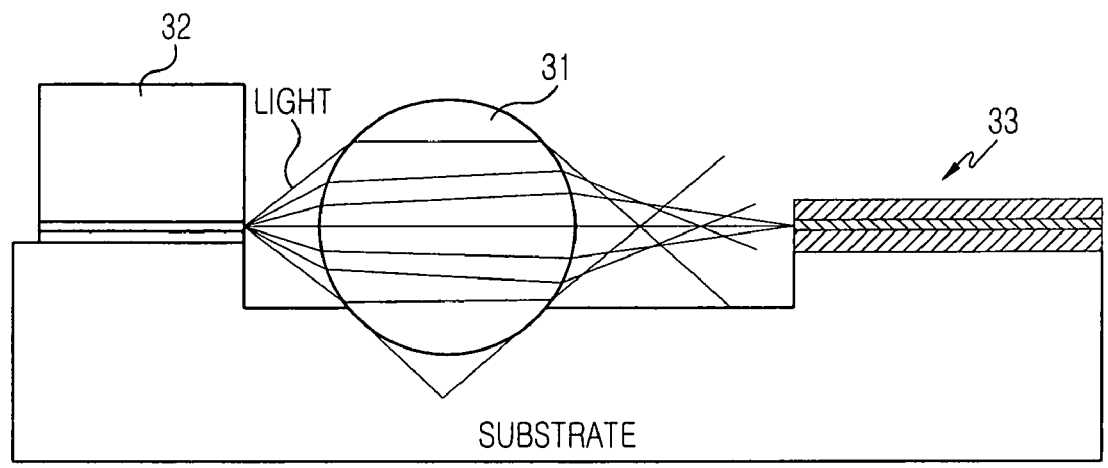
FIG. 3 depicts a conventional optical coupling method between an LD and a PLC using a spherical lens.
Figure 4:
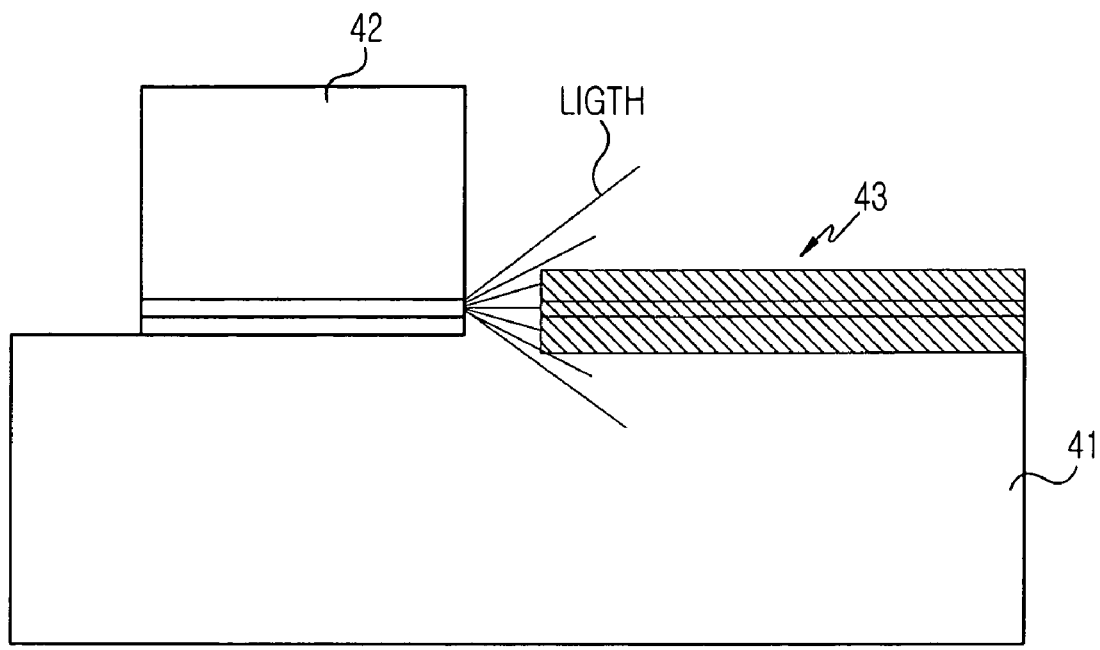
FIG. 4 depicts a conventional direct optical coupling method between an LD and a PLC.

Referring to FIG. 9, a micro-lens 94 is integrated between an LD 92 mounted by flip-chip bonding and a PLC 93 on a substrate 91. As compared to the conventional direct optical coupling illustrated in FIG. 4, significantly higher coupling efficiency is achieved with the present invention if the flip-chip bonding accuracy is the same as that shown in FIG. 4.

FIGS. 10A to 10E are views sequentially illustrating a method of fabricating an optical module with a spherical lens and a PLC integrated therein as illustrated in FIG. 9.

Figure 10:
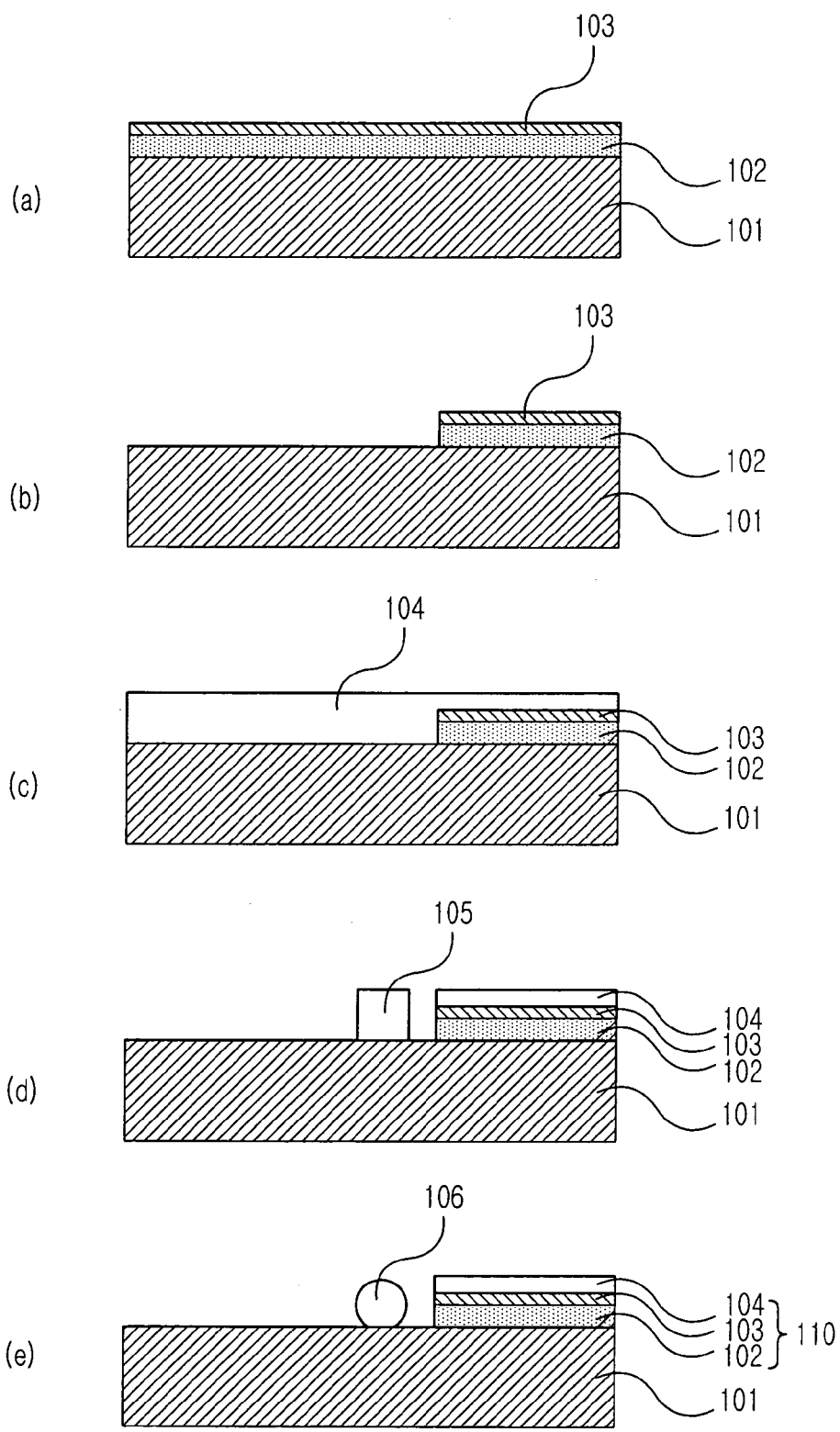
FIGS. 10A to 10E sequentially illustrate a method of fabricating an optical module having a spherical lens and a PLC integrated therein according to the preferred embodiment of the present invention.

In FIG. 10A, a lower cladding layer 102 and a core layer 103 are formed on a substrate 101 in a general PLC fabrication process.

In FIG. 10B, the core layer 103 and the lower cladding layer 102 are selectively etched to form a PLC pattern. Although the lower cladding layer 102 other than in a PLC forming area is etched away to expose the substrate 101 is shown in this aspect of the present invention, the lower cladding layer 102 may remain on the substrate 101 in an area other than the PLC forming area according to the thickness of the lower cladding layer 102, or the exposed substrate 101 may further be etched when necessary. If the substrate 101 is quartz, for example, there needs to be etching of the quartz to a predetermined thickness because the substrate 101 itself serves as the lower cladding layer 102.

In the general PLC fabricating process according to the present invention, an etching depth, that is, the thickness from the upper surface of the core layer to an etched-down position is equal to or greater than the height of the core layer. In other words, the lower cladding layer is usually not etched or etched slightly to a depth of several micrometers or less. Yet, the etching is done to a depth sufficient for uniform formation of an upper cladding layer 104 which will be formed later for formation of a micro-lens 106 in FIG. 10B, and the etching depth is controlled such that the height of the center of the core layer 103 coincides with the center of the micro-lens 106.

In FIG. 10C, the upper cladding layer 104 is deposited on the core layer 103 and the substrate 101, thereby forming a PLC.

In FIG. 10D, the upper cladding layer 104 other than in the PLC forming area and a lens forming area is removed. Thus, a thin-film structure 105 is formed of the upper cladding layer 104 in front of the PLC.

In FIG. 10E, the thin-film structure 105 is thermally treated, thereby completing the spherical micro-lens 106 by reflow.

Figure 11:
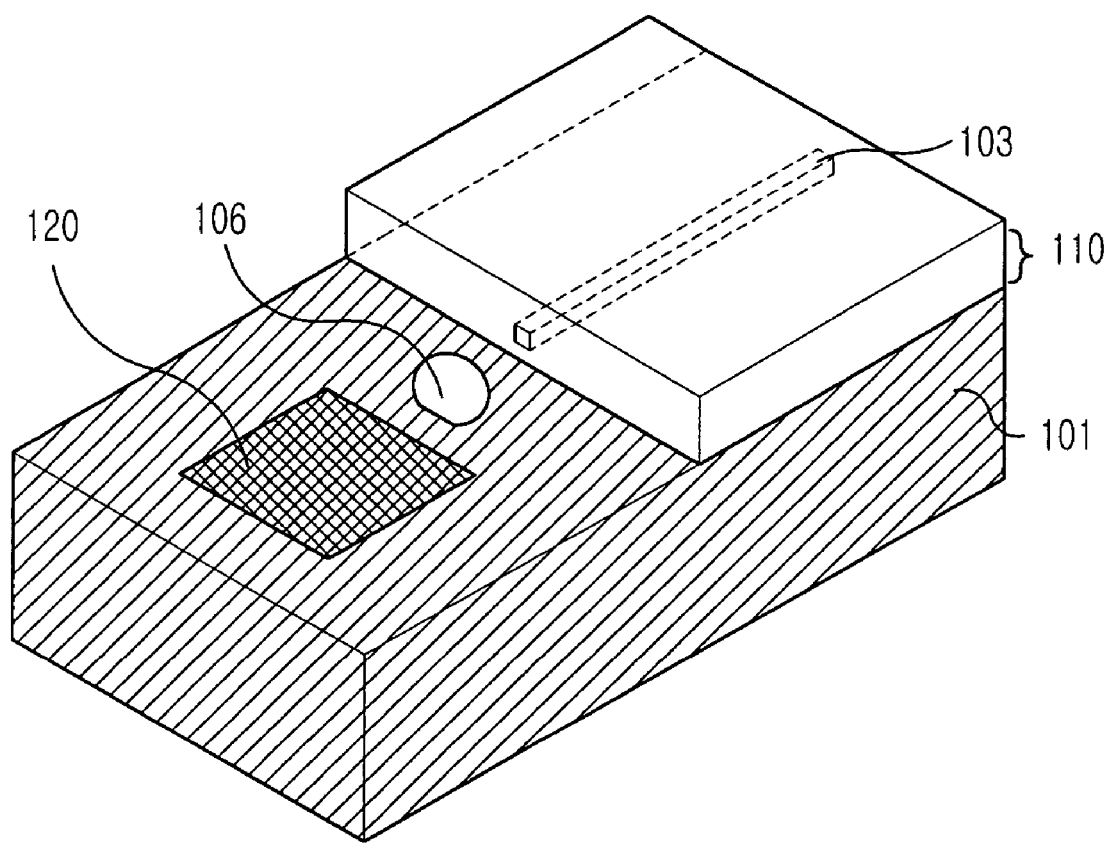
FIG. 11 is a perspective view of an optical module illustrated in FIG. 10E.

FIG. 11 is a perspective view of the optical module illustrated in FIG. 10E. The reference numeral 120 denotes an area on which a light emitting/receiving device is to be mounted.

A non-reflective coating step can be added to the above fabrication process in order to reduce reflection-caused loss. It can be carried out on a substrate basis or a chip basis.

As described above, the present invention offers the following benefits.

(1) Micro-lenses of various sizes and shapes and an array having such micro-lenses can be effectively fabricated as compared to the conventional methods. Especially, a three-dimensional spherical lens can be formed which is capable of collecting light perpendicularly to or in parallel to a substrate with optical devices integrated thereon.

(2) Since a micro-lens can be integrally formed with a PLC, the lens fabrication is simplified and the lens is easily aligned with an optical fiber or a light waveguide.

(3) The utilization of reflow from surface tension involved with high-temperature treatment of an etched thin-film structure facilitates control of the lens shape adaptively to the change of process conditions, increases reproducibility, and obviates the need for using additional equipment and materials. Thus, the micro-lens can be produced at low cost.

While the invention has been shown and described with reference to a certain preferred embodiment thereof, it will be understood by those skilled in the art that various modifications in the form and details may be made therein without departing from the spirit of the invention and the scope of the appended claims.

What is claimed is:

1. A method of fabricating an optical module having a micro-lens integrated therein, comprising the steps of:
   (a) sequentially forming a lower cladding layer and a core layer on a substrate;
   (b) forming a planar lightwave circuit (PLC) pattern on the substrate by selectively etching the core layer and the lower cladding layer;
   (c) forming a PLC by forming an upper cladding layer on the overall surface of the substrate;
   (d) forming a thin-film structure in a lens forming area by selectively removing the upper cladding layer in an area other than the area of the PLC and the lens forming area; and
   (e) forming the micro-lens by reflow by thermally treating the thin-film structure.

2. The method of claim 1, wherein the thin film is formed of $SiO_2$ containing a dopant.

3. The method of claim 2, wherein the dopant comprises one of $GeO_2$, $P_2O_5$, $B_2O_3$, $TiO_2$, and $Al_2O_3$.

4. An optical module manufactured according to the process recited in claim 3.

5. The method of claim 2, wherein the dopant includes one or more materials selected from the group consisting of $GeO_2$, $P_2O_5$, $B_2O_3$, $TiO_2$, and $Al_2O_3$.

6. The method of claim 1, wherein the shape of the micro-lens is controlled according to the shape of the photoresist pattern and the thickness of the upper cladding layer.

7. The method of claim. 1, further comprising: (f) forming a non-reflective coating layer on the surface of the micro-lens.

8. An optical module manufactured according to the process recited in claim 1.

9. An optical module having a micro-lens integrated therein, comprising:
   a planar lightwave circuit (PLC) comprising a lower cladding layer and a core layer arranged on a substrate to form a PLC area; and
   an upper cladding layer arranged on the PLC area and a lens forming area adjacent the PLC area; and
   a lens comprising a controlled reflow of the upper cladding arranged on the lens forming area.

* * * * *